United States Patent [19]

Doeuvne et al.

[11] Patent Number: 4,996,436
[45] Date of Patent: Feb. 26, 1991

[54] AUTOMATIC APPARATUS FOR CONTROLLING THE SIZE OF WAFER-SUPPORTING BOATS

[75] Inventors: Jean P. Doeuvne; Guy Mascarin, both of Meylan, France

[73] Assignee: French State represented by the Minister of Post, Telecommunications and Space, France

[21] Appl. No.: 487,899

[22] Filed: Mar. 6, 1990

[30] Foreign Application Priority Data

Mar. 7, 1989 [FR] France ................. 89 03422

[51] Int. Cl.⁵ .......................................... G01N 21/86
[52] U.S. Cl. ...................................... 250/560; 414/416
[58] Field of Search ............... 250/560, 561; 414/416, 414/255

[56] References Cited

U.S. PATENT DOCUMENTS

| | | | |
|---|---|---|---|
| 4,722,659 | 2/1988 | Hoyt, III et al. | 414/416 |
| 4,770,590 | 9/1988 | Hugues et al. | 414/225 |
| 4,840,530 | 6/1989 | Nguyen | 414/416 |

FOREIGN PATENT DOCUMENTS

| | | |
|---|---|---|
| 61-278768 | 4/1985 | Japan . |
| 400582 | 5/1962 | Switzerland . |
| 1392816 | 3/1972 | United Kingdom . |

Primary Examiner—David C. Nelms
Assistant Examiner—Que Tan Le
Attorney, Agent, or Firm—Lowe, Price, LeBlanc, Becker & Shur

[57] ABSTRACT

An apparatus for controlling the size of a wafer supporting boat such that the wafers maintained by the boat have to be positioned at predetermined distances from at least two specific utmost faces of said boat. This apparatus comprises a slanted plane (31), two reference surfaces (32), guiding means (34) arranged in order that, when the boat is laid on the slanted plane, it may slide on it in such a way that the utmost faces abut against the reference surfaces, at least one plate (50) provided with a portion of reference groove (51) arranged so as to prolong according to their plane the supporting grooves of a wafer at a determined position. Thus, when the utmost faces are abuting against the reference surfaces, a wafer can be inserted into its supporting grooves and into the reference groove only if the size of the boat corresponds to a determined standard.

8 Claims, 3 Drawing Sheets

AUTOMATIC APPARATUS FOR CONTROLLING THE SIZE OF WAFER-SUPPORTING BOATS

BACKGROUND OF THE INVENTION

The present invention relates to the field of integrated circuit manufacturing wherein numerous steps are carried out while wafer are grouped into batches on wafer-supporting boats.

Those boats must be able to be introduced into processing apparatuses (ovens, reactors, etc.) and have to conform to apparatuses automatically transferring wafer from one boat to another.

It is then essential that the size of the boats be accurate in order than, on the one hand, the wafers are properly positioned in a processing apparatus wherein they are to be inserted and, on the other hand, in such a way that the transfer apparatus does not break wafers when it takes them or lays them down.

Up to now, in order to control those sizes, the wafer manufacturers have simply carried out their manufacturing operations as carefully as possible, manually measuring, individually and independently, various sizes of the manufactured state.

The object of the invention is to provide for an automatic apparatus controlling the size of the wafer-supporting boats.

SUMMARY OF THE INVENTION

To achieve this object, the invention provides for an apparatus controlling the size of a wafer-supporting boat such that the wafers are maintained by the boat have to be positioned at predetermined distances from at least two specific utmost faces of this boat, comprising:

a slanted surface, two reference surfaces, guiding means arranged in order that, when the boat is laid on the slanted surface, it may slide on it in such a way that said utmost faces normally abut against said reference surfaces, at least one plate provided with at least one reference groove portion arranged so as to prolong according to their plane the grooves supporting a wafer at a predetermined position.

Thus, when the utmost faces are abuting against reference surfaces, a wafer can be inserted in its supporting grooves and in the reference groove only if the size of the boat corresponds to a standard determined by the relative distances between the reference surfaces and the reference groove.

Preferably, the apparatus according to the invention comprises means for detecting the support of the utmost faces against the reference surfaces and for detecting the insertion of a wafer into the reference groove.

The support detecting means can be made of push-button contacts flush with the reference surface at the point against which the utmost faces are to abut.

The insertion detecting means are constituted by an assembly of a photodetector and a photoreceptor arranged on both sides of the reference groove.

Preferably, the apparatus according to the invention is manufactured in the form of a portable and independent apparatus comprising power supply means.

One of the advantages of such an apparatus is that its design is extremely simple and it can be manufactured at low cost in the form of a light portative an not cumbersome apparatus. Thus, this apparatus is liable to be used either by the wafer manufacturer or by the integrated circuit manufacturer who desires to control the boats before using same, therefore avoiding losing whole manufacturing batches.

BRIEF DISCLOSURE OF THE DRAWINGS

The foregoing and other objects, features and advantages of the invention will be apparent from the following detailed description of preferred embodiments as illustrated in the accompanying drawings wherein:

FIG. 2 is a simplified side and section view according to line A—A of FIG. 3 of an apparatus according to the invention;

FIG. 3 is a top view of an apparatus according to the invention;

FIG. 4 is a view according to arrow B of FIG. 2 of an apparatus according to the invention; and FIG. 5 is a section view along lines C—C of FIG. 2 of an apparatus according to the invention.

DESCRIPTION OF A PREFERRED EMBODIMENT

Figure 1:
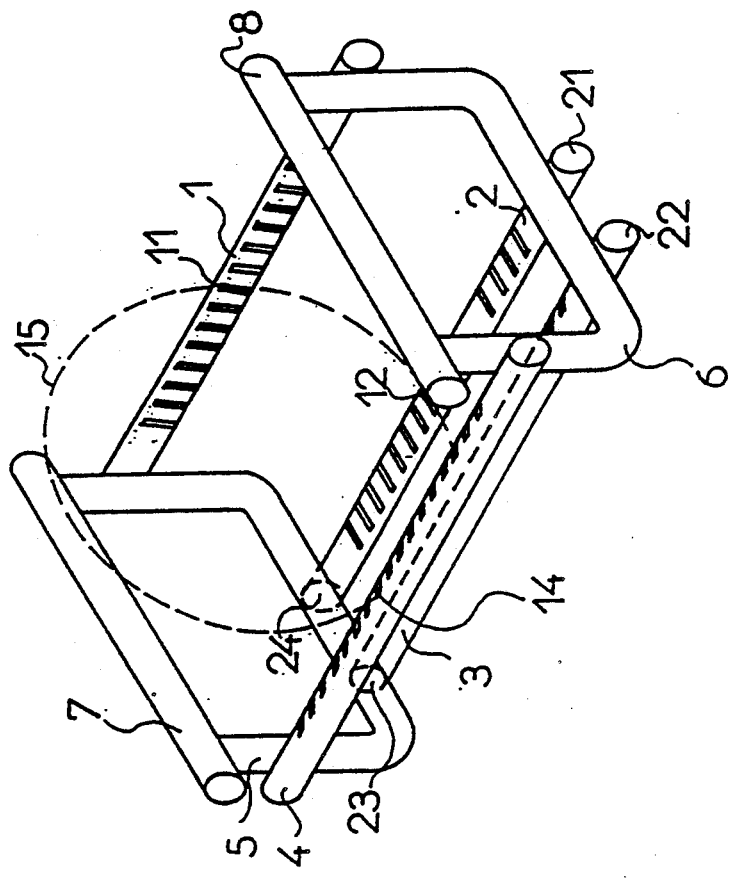
FIG. 1 is a perspective view of a boat according to the invention.

FIG. 1 shows a typical exemplary wafer-supporting boat such as used in the integrated circuit manufacturing industry. This quartz boat comprises four parallel rods 1, 2, 3 and 4. Those rods are assembled one with respect to the other by fixing means to two U-shaped supports 5 and 6, the upper parts of which comprises gripping handles 7 and 8.

Corresponding grooves 11, 12, 13, 14 are arranged in rods 1, 2, 3 and 4 according to successive parallel planes perpendicularly to the direction of the rods so as to maintain wafers 15 vertically. It will be appreciated that it is possible to arrange the plates of those grooves so that the wafers are maintained according to a given angle with respect to the vertical direction.

The groove planes, that is, the positions at which wafers 15 have to be maintained inside the boat, have to be accurately determined with respect to a reference point associated to the boat body, for example with respect to the utmost faces 21 and 22, on the one hand, 23 and 24, on the other hand, of rods 2 and 3.

This positioning has to be accurate in several utilization cases, for example for automatically transferring wafers from one boat to another. In this case, a gripping device catches one, several or the whole set of wafers contained in a boat for inserting same into one or several other boats. If the relative position of the various grooves of the various boats is not precisely known, the transfer apparatus will misplace the wafers in the reception boat(s), which may cause the wafers to get broken or to fall.

Thus, the invention provides for an apparatus controlling the size of a boat. This apparatus is illustrated in FIGS. 2–5 in the specific case the boat to be controlled is such as shown in FIG. 1. In FIGS. 2–5 same components are designated by same reference numerals.

The apparatus comprises a box 30 wherein is mounted an L-shaped plate comprising a slanted plane 31 and a supporting surface 32. Pads 34, protruding with respect to the slanted plane 31 are designed to ensure guiding of the lower rods 2 and 3 of the boat. Those lower rods are schemically shown in FIGS. 4 and 5.

The contact extremity 41 of push-button detectors 40 passes through the supporting plate 32, at the position where the extremity planes (reference planes) of rods 2 and 3 are to abut. The sensitivity of those detectors is commonly about one tenth of a millimeter. It is then possible to detect whether rods 2 and 3, positioned by pads 34, properly abut against contacts 41. Once the boat is properly positioned, it is only necessary to determine whether the groove planes are positioned at proper distances (within a predetermined tolerance) from the above mentioned reference planes. Indeed, this determination will be carried out for only one of the groove planes can be obtained with a high accuracy by using a multiwheel saw to simultaneously form all the grooves.

Thus, for determining the accuracy of the size between the above mentioned reference planes and the plane of the whole set of wafer supporting grooves, the invention provides for arranging a plate 50 in the way illustrated. This plate is provided with apertures adapted to the specific boat to be controlled to allow this boat to be positioned and to slide against supporting plane 32 as described hereinabove. Plate 50 is cut out and provided with a groove 51 which, when the boat is properly positioned, complete the grooves of a groove plane for rods 1, 2, 3 and 4, so that, as shown in FIG. 5, a wafer can be simultaneously inserted into grooves 11, 12, 13 and 14 of the boat and into the portion(s) of grooves 51 of plate 50. If the positioning of the considered groove plane of the boat rods with respect to the reference surfaces of this boat does not meet the predetermined standards, it will not be possible to insert the wafer since it will abut against the protruding portion of either rods 1-4 or plate 50.

Moreover, the invention provides for a detector 53 indicating the proper positioning of a wafer in the grooves of the boat and plate 50. This detector is for example of the optoelectronic type and comprises for example a photoemissive diode and a diode or a photo-receiving transistor in register with each other.

To sum up, the apparatus according to the invention comprises a specific mechanical structure and three detectors, two being designed to determine the proper positioning of the boat and one to determine the insertion of a wafer. Once such detectors are available, those skilled in the art of electronics, logic circuits and displays will be able to derive an appropriate indication. For example, it will be possible to provide for an indicating lamp (61-63) associated with each of the detectors lighting up when the latter is properly actuated (that is, when push-buttons 41 are pushed and when a wafer interrupts the path between the photo-emissive diode and the photoreceptor diode). An additional indicating lamp can be associated to a defect detection, that is, to the non-lighting of one of the above indicating lamps. Moreover, it will be possible to provide for a test control 65 for controlling the proper operation of the indicating lamps.

Of course, the invention is liable of numerous variants and modifications which will clearly appear to those skilled in the art. The controlling apparatus according to the invention has been described as part of a specific boat and a specific positioning of its reference planes. It is apparent that such a boat could comprise more than two reference planes, that those reference planes are not necessarily at the same level, are possibly shifted one with respect to the other, or are in oblique planes one with respect to the other. In the latter case, the supporting surface instead of being a single surface could be a dihedron.

Similarly, a slanted plane on which is laid the boat to be tested has been described but it could be possible to provide for a horizontal sliding surface on which the boat is pushed.

Moreover, it will be noted that an apparatus according to the invention is easily implementable in the form of an independent apparatus, box 30 containing for example batteries and all the required logic circuits.

We claim:

1. An apparatus for controlling the size of a wafer-supporting boat such that the wafers maintained by the boat have to be positioned at predetermined distances from at least two specific utmost faces of said boat, comprising:
   a slanted plane surface,
   two reference surfaces,
   guiding means arranged in order that, when the boat is laid on said slanted plane surface, it may slide on it in such a way that said utmost faces normally abut against said reference surfaces,
   at least one plane provided with at least one reference groove portion arranged so as to prolong according to their plane grooves supporting a wafer at a determined position,
   whereby, when the utmost faces are abuting against said reference surfaces, a wafer can be inserted in its supporting grooves, and in the reference groove only if the size of the boat corresponds to a standard determined by the relative distances between the reference surfaces and the reference groove.

2. A size control apparatus according to claim 1, comprising means for detecting the abutment of said utmost faces against said reference surfaces and means for detecting the insertion of a wafer into said reference groove.

3. A size control apparatus according to claim 2, wherein said abutment detecting means are constituted by push-button contacts flush with the reference surface at the points against which the utmost faces are to abut.

4. A size control apparatus according to claim 2, wherein said insertion detecting means comprise an assembly of a photodetector and a photoreceptor arranged on both edges of said reference groove.

5. A size control apparatus according to claim 2, wherein an indicating lamp is associated with each of said detecting means.

6. A size control apparatus according to claim 5, comprising an additional indicating lamp operating complementarily to the other three lamps.

7. A size control apparatus according to claim 1 manufactured in the form of a portable and independent apparatus, comprising power supply means.

8. A size control apparatus according to claim 1, wherein said boat comprises four parallel rods provided with grooves for inserting the wafers arranged according to successive planes perpendicularly to said rods, the extremities of two of the rods corresponding to said utmost faces, wherein the guiding means are pads (34) provided on said slanted plane surface for allowing said rods to slide parallel to their axis.

* * * * *